(12) United States Patent
Nakagawa et al.

(10) Patent No.: US 7,643,358 B2
(45) Date of Patent: Jan. 5, 2010

(54) NON VOLATILE SEMICONDUCTOR MEMORY DEVICE

(75) Inventors: Michio Nakagawa, Yokohama (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 379 days.

(21) Appl. No.: 11/756,936

(22) Filed: Jun. 1, 2007

(65) Prior Publication Data
US 2007/0278555 A1 Dec. 6, 2007

(30) Foreign Application Priority Data
Jun. 2, 2006 (JP) ............... 2006-155407

(51) Int. Cl.
*G11C 7/00* (2006.01)
(52) U.S. Cl. ............... 365/189.11; 365/189.09; 365/185.18; 365/185.23
(58) Field of Classification Search ............ 365/185.18, 365/185.23, 189.11, 189.09
See application file for complete search history.

(56) References Cited
U.S. PATENT DOCUMENTS
5,909,396 A * 6/1999 Le et al. .............. 365/185.23

6,621,735 B2 9/2003 Nakamura et al.
7,071,763 B2 * 7/2006 Blyth .................. 327/436

FOREIGN PATENT DOCUMENTS

| GB | 2 291 296 A | 1/1996 |
|---|---|---|
| JP | 5-259473 | 10/1993 |
| JP | 2002-63795 | 2/2002 |

* cited by examiner

*Primary Examiner*—Hoai V Ho
*Assistant Examiner*—Kretelia Graham
(74) *Attorney, Agent, or Firm*—Oblon, Spivak, McClelland, Maier & Neustadt, L.L.P.

(57) ABSTRACT

A non volatile semiconductor memory device wherein it is possible to transfer Vpp without a drop in voltage of the transfer transistor Vth (threshold voltage) in a transfer circuit or decoder circuit for selectively transferring Vpp by using a usual LVP (low voltage P type transistor) to reduce step(s) of production process and costs. An LVP (low voltage P type transistor) instead of a HVP (high voltage P type transistor) for a transfer circuit is used. Two-way diodes each of which threshold value becomes about Vdd are inserted between the gate and the drain.

20 Claims, 17 Drawing Sheets

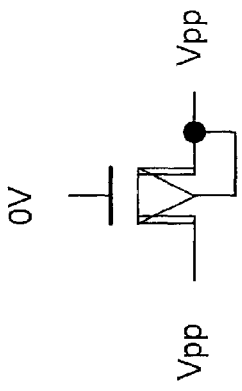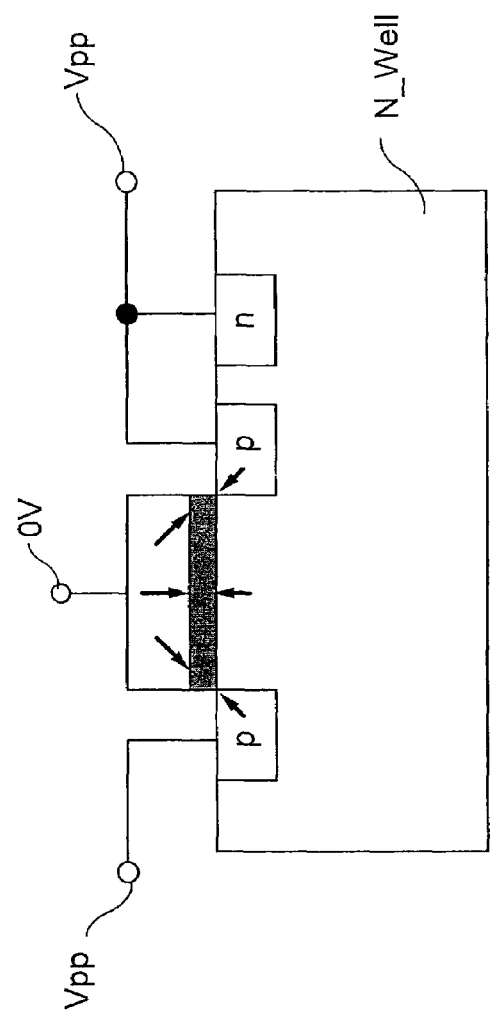
Fig.10 PRIOR ART

Fig.13
PRIOR ART
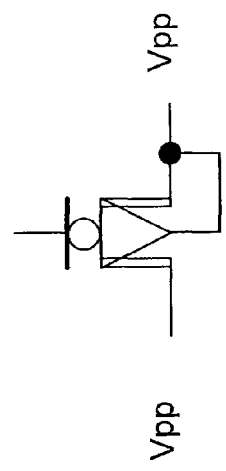
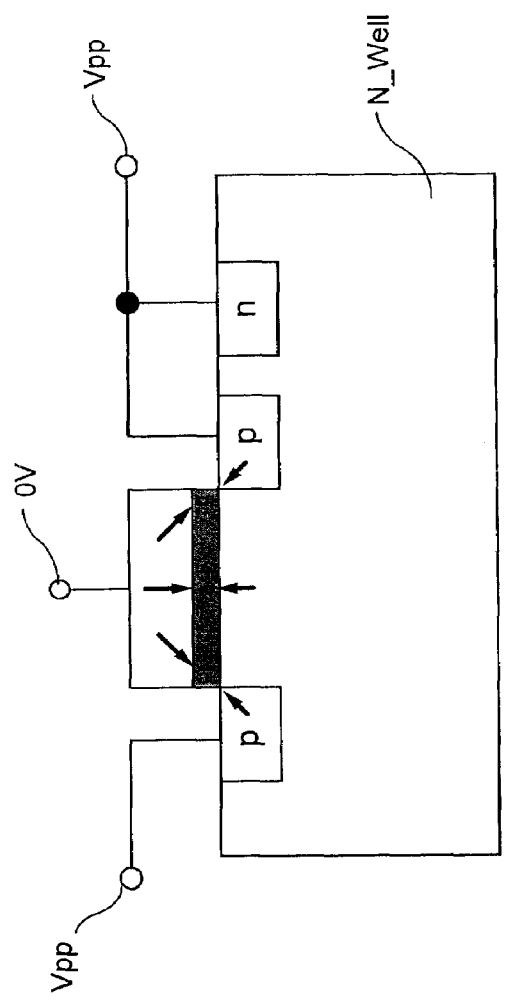
1202 HPE Tr_2(ON)

1202 HPE Tr_2(OFF)

NON VOLATILE SEMICONDUCTOR MEMORY DEVICE

CROSS-REFERENCE TO RELATED APPLICATION

This application is based upon and claims the benefit of priority from the prior Japanese Patent Application No. 2006-155407, filed on Jun. 2, 2006, the entire content of which is incorporated herein by reference.

BACKGROUND OF THE INVENTION

1. Field of the Invention

This invention is related to a non volatile semiconductor memory device which includes a voltage transfer circuit which transfers a high voltage within every operation such as write (program) erasure and read.

2. Description of the Related Art

A high voltage (below referred to as [Vpp]) which is higher than a power supply voltage (below referred to as [Vdd]) is generated aside from the power supply voltage to be used in operations such as data program, erasure, and read. Conventionally, a boost voltage circuit for boosting Vdd, and a voltage transfer circuit or a decoder circuit for selectively transferring Vpp are needed in a non volatile semiconductor memory device in order to generate the high voltage used in above mentioned operations.

As an example of a transfer circuit, a Level Shifter which is comprised of a HVP (high voltage P type transistor) is known. A P type transistor is used because unlike an N type transistor it is possible to transfer a voltage without a drop in voltage at the time of transfer.

However, because a process to manufacture a transistor with a high resistance is needed for the Level Shifter which is comprised of a conventional HVP, there are more steps of a production process to make manufacturing costs high (see, for example, Japanese Laid-Open patent Publication No. 2002-63795).

BRIEF SUMMARY OF THE INVENTION

According to one embodiment of the present invention, a non volatile semiconductor memory device comprises a voltage transfer circuit which transfers a transfer voltage boosted from a power supply voltage, the voltage transfer circuit including;
  an N type transistor applied with the transfer voltage;
  a P type transistor applied with a transfer control signal;
  a first diode circuit a forward voltage of which is about the same as the power supply voltage, is inserted between a gate and a drain of the P type transistor; and
  a second diode circuit, a forward voltage of which is about the same as the power supply voltage is connected in a an opposite direction to the first diode circuit and is inserted between the gate and the drain of the P type transistor.

According to another embodiment of the present invention, a non volatile semiconductor memory device, comprising:
  a memory cell array having a plurality of blocks each having a plurality of memory cells arranged in a matrix; and
  a voltage transfer circuit which transfers a transfer voltage boosted from a power supply voltage, the voltage transfer circuit transferring a voltage to a block selected from among the plurality of blocks and including;
  an N type transistor applied with the transfer voltage,
  a P type transistor applied with a transfer control signal,
  a first diode circuit, a forward voltage of which is about the same as the power supply voltage, is inserted between a gate and a drain of the P type transistor, and
  a second diode circuit, a forward of which voltage is about the same as the power supply voltage, is connected in a an opposite direction to the first diode circuit and is inserted between the gate and the drain of the P type transistor.

According to another embodiment of the present invention, a non volatile semiconductor memory device comprising:
  a plurality of memory cell arrays each having a plurality of blocks each having a plurality of memory cells arranged in a matrix; and
  a voltage transfer circuit which transfers a transfer voltage boosted from a power supply voltage, the voltage transfer circuit transferring a voltage to a memory cell selected from among the plurality of the memory cells and including;
  an N type transistor applied with the transfer voltage,
  a P type transistor applied with a transfer control signal,
  a first diode circuit, a forward voltage of which is about the same as the power supply voltage, is inserted between a gate and a drain of the P type transistor, and
  a second diode circuit, a forward voltage of which is about the same as the power supply voltage, is connected in a an opposite direction to the first diode circuit which is inserted between the gate and the drain of the P type transistor.

BRIEF DESCRIPTION OF THE DRAWINGS

FIG. 10 is a model diagram of a transistor when one of the P type transistors of the transfer circuit shown in FIG. 9 is ON.

FIG. 13 is a model diagram of a transistor 12 when one of the P type transistors of the transfer circuit shown in figure is ON.

FIG. 16 is a model diagram of a transistor when the P type transistor of the transfer circuit shown in FIG. 15 is ON.

DETAILED DESCRIPTION OF THE INVENTION

Figure 1:
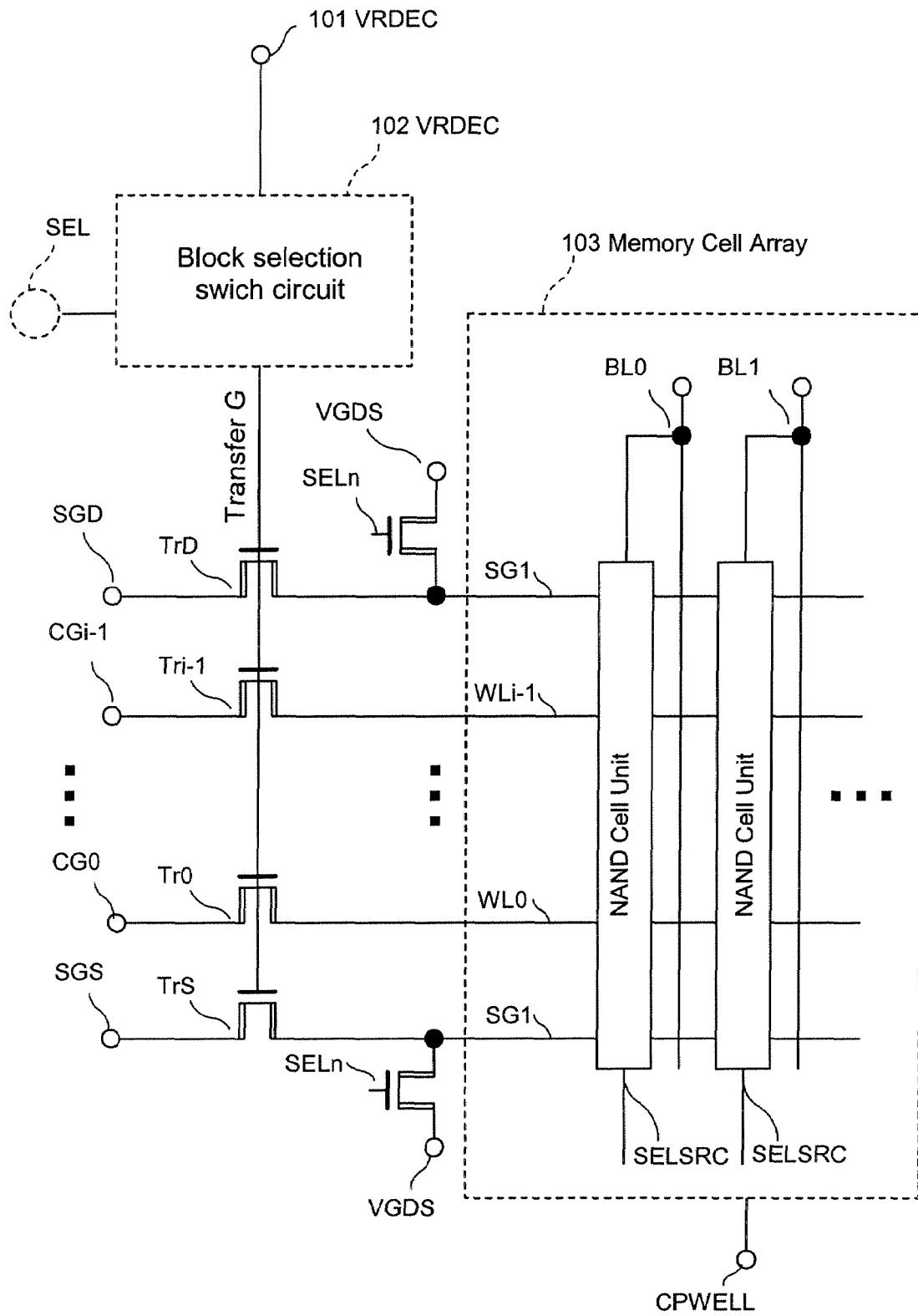
FIG. 1 is an outline diagram of a non volatile semiconductor memory device related to a first embodiment of the present invention.

Preferred embodiments of the present invention will be explained in detail below while referring to the drawings. However, it is possible to realize the invention in many of the other embodiments and it is not limited to the cited details of the embodiments shown below.

Figure 9:
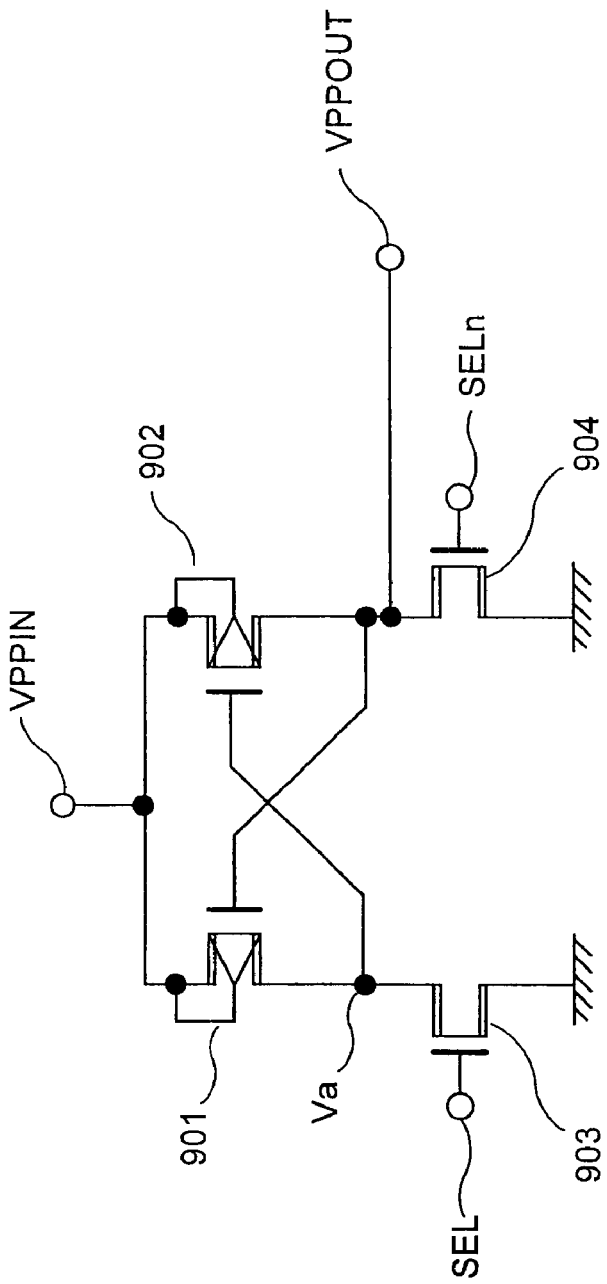
FIG. 9 is a diagram which shows a transfer circuit using conventional high voltage P type transistors.
Figure 11:
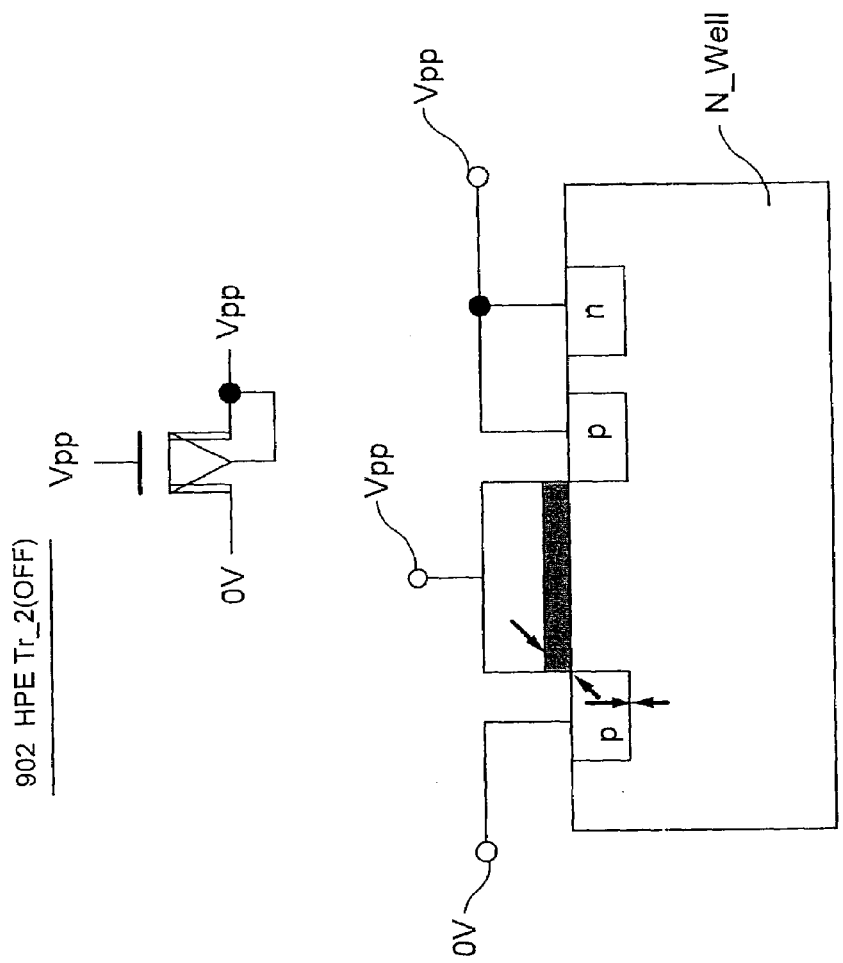
FIG. 11 is a model diagram of a transistor when one of the P type transistors of the transfer circuit shown in FIG. 9 is OFF.

A voltage transfer circuit which uses 2 HVP 901 and 902 is shown in FIG. 9. FIG. 10 is a model diagram of a transistor when the HVP 902 is ON in the voltage transfer circuit shown in FIG. 9 and shows the area affected by stress. FIG. 11 is a model diagram when the HVP 902 is OFF in the voltage transfer circuit shown in FIG. 9 and shows the area affected by stress.

In the voltage transfer circuit shown in FIG. 9, when the HVP 902 is ON, 0 v is applied to a gate as shown in FIG. 10 and Vpp is applied to a source and a drain. Because of this, the resistance to the stress of more than Vpp on the oxide layer between the gate and the source, between the gate and the drain, and between the gate and the channel is required. Also, when the HVP 902 is OFF, Vpp is applied to the gate and the source as shown in FIG. 11 and 0 v is applied to the drain. Because of this, the resistance to the stress of more than Vpp on the oxide layer between the gate and the drain is required and the resistance to the stress of more than Vpp on the PN junction between the drain and the well is also required.

There are problems in that a high resistance transistor requires a high level of technology and more steps to manufacture, and the circuit area becomes larger.

Figure 12:
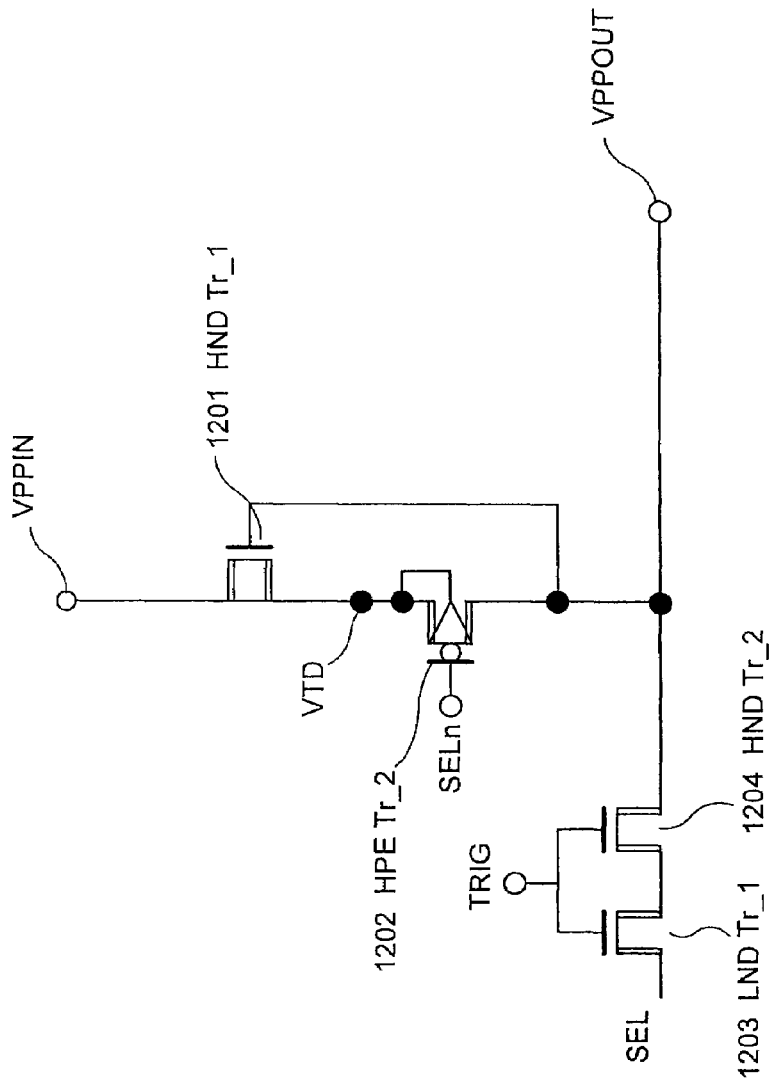
FIG. 12 is a diagram which shows a transfer circuit by a different conventional construction.
Figure 14:
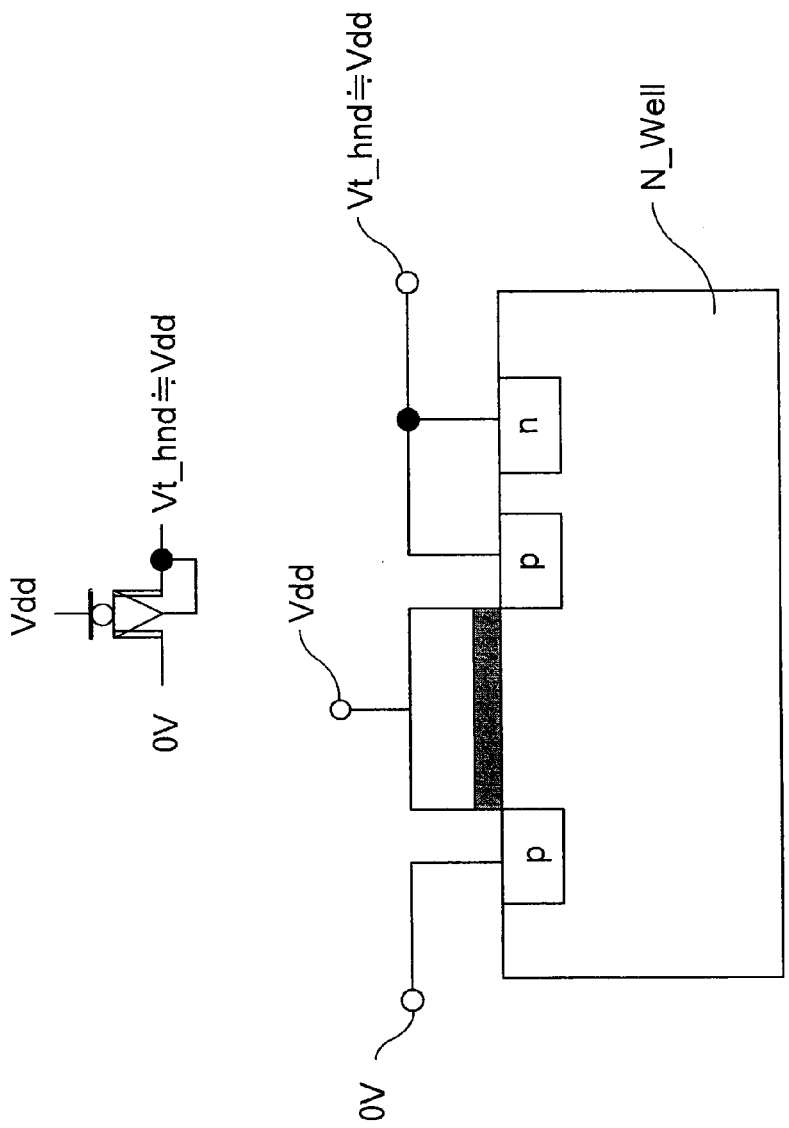
FIG. 14 is a model diagram of a transistor when one of the P type transistors of the transfer circuit shown in FIG. 12 is OFF.

FIG. 12 is a circuit diagram which shows a voltage transfer circuit of a different construction. FIG. 13 is a model diagram of a transistor when a HVP 1202 is ON in the transfer circuit shown in FIG. 12 and shows the area affected by stress. FIG. 14 is a model diagram of a transistor when the HVP 1202 is OFF in the transfer circuit shown in FIG. 12 and shows the area affected by stress.

The voltage transfer circuit shown in FIG. 12 uses HVP 1202 as a transfer switch and uses a HND (D type high voltage N type transistor) 1201 of D type (Depression Type, threshold value is a negative voltage) as a protection circuit of the above stated HVP 1202.

In the voltage transfer circuit shown in FIG. 12, when HVP 1202 is OFF, Vdd is applied to a gate as shown in FIG. 14, a source has an electrical potential a threshold voltage Vt_hnd, (a value close to Vdd) higher than the gate, and is charged becoming a floating state and 0 v is applied to the drain. Because the stress between the gate and the drain and between the source and the well is about Vdd it is sufficient if there is a resistance of a usual low voltage transistor level. However, when the HVP 1202 is ON, 0 v is applied to the gate as shown in FIG. 13 and Vpp is applied to the source and the drain. Because of this, the resistance to the stress of more than Vpp on the oxide layer between the gate and the source, between the gate and the drain, and between the gate and the channel is required.

Therefore, as in the voltage transfer circuit shown in FIG. 9, a high resistance transistor is needed and the process in a high resistance transistor requires a high level of technology and more steps to manufacture, and the circuit area becomes larger.

Figure 15:
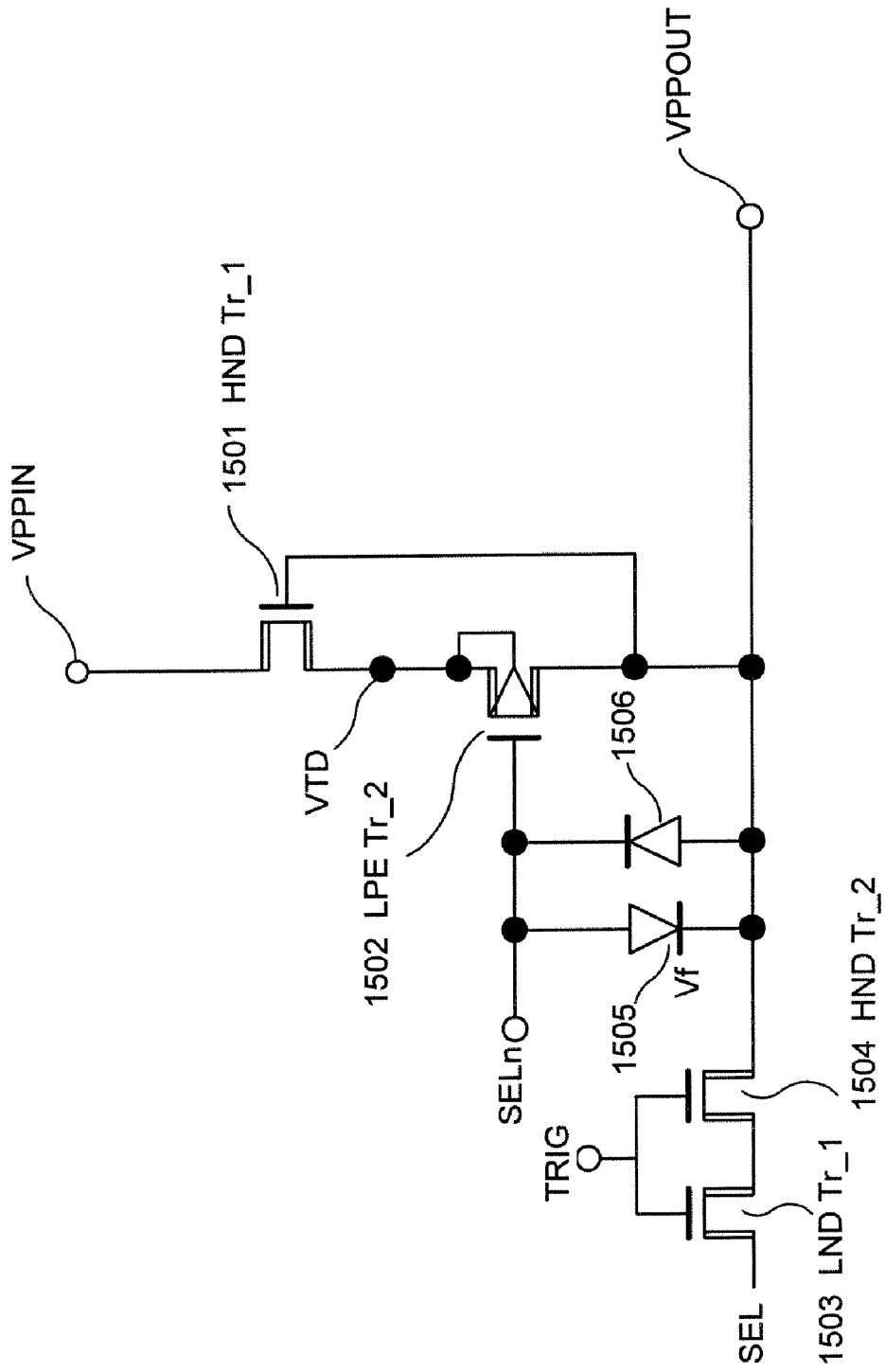
FIG. 15 is a diagram which shows a transfer circuit which uses a low voltage P type transistor instead of a high voltage P type transistor shown in FIG. 12.

In order to solve the above stated problems, in the present invention, a low voltage P type transistor LPE 1502 is used, as shown in FIG. 15, instead of the HVP 1202 of the voltage transfer circuit, as shown in FIG. 12, and two-way diodes, specifically a diode 1505 as a second diode circuit and a diode 1506 as a first diode circuit each of which has a threshold value of about Vdd, are inserted between the gate and the drain.

Figure 16:
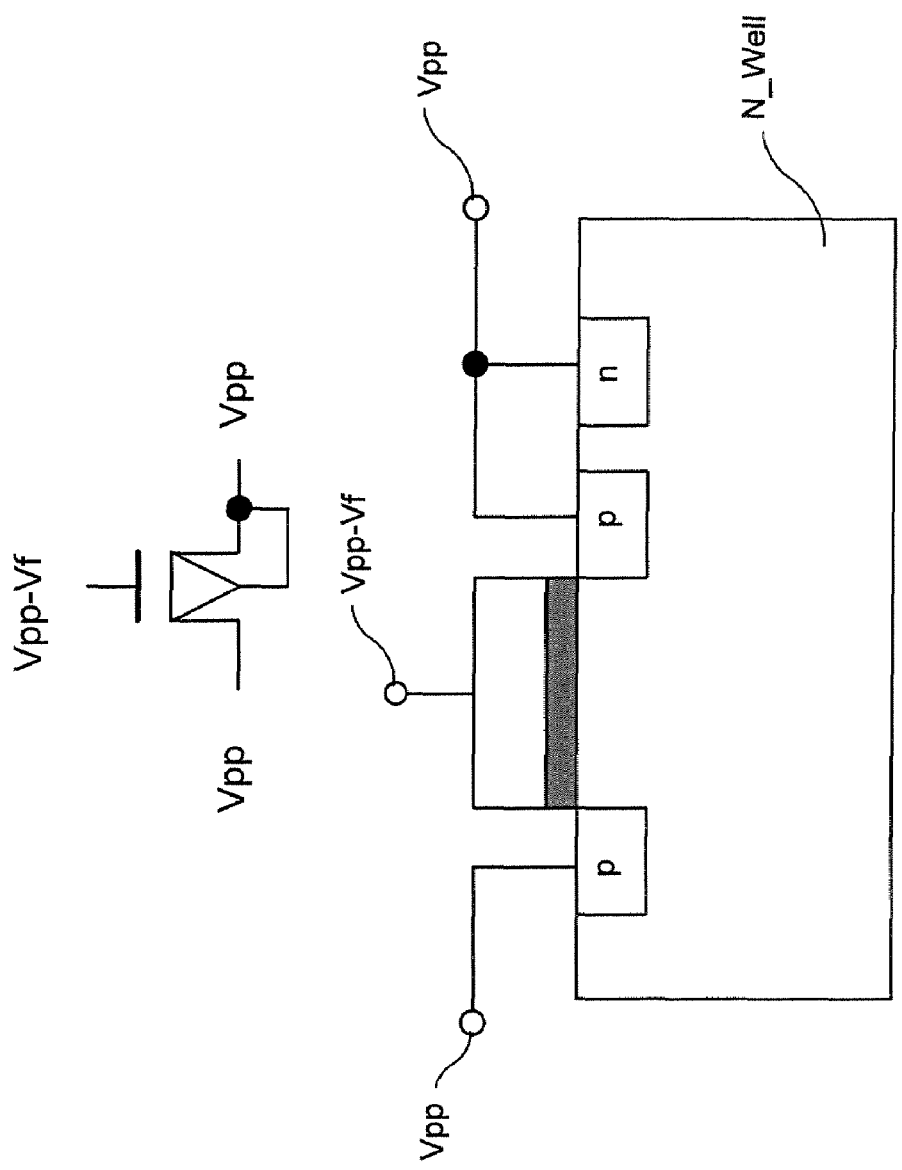
Figure 17:
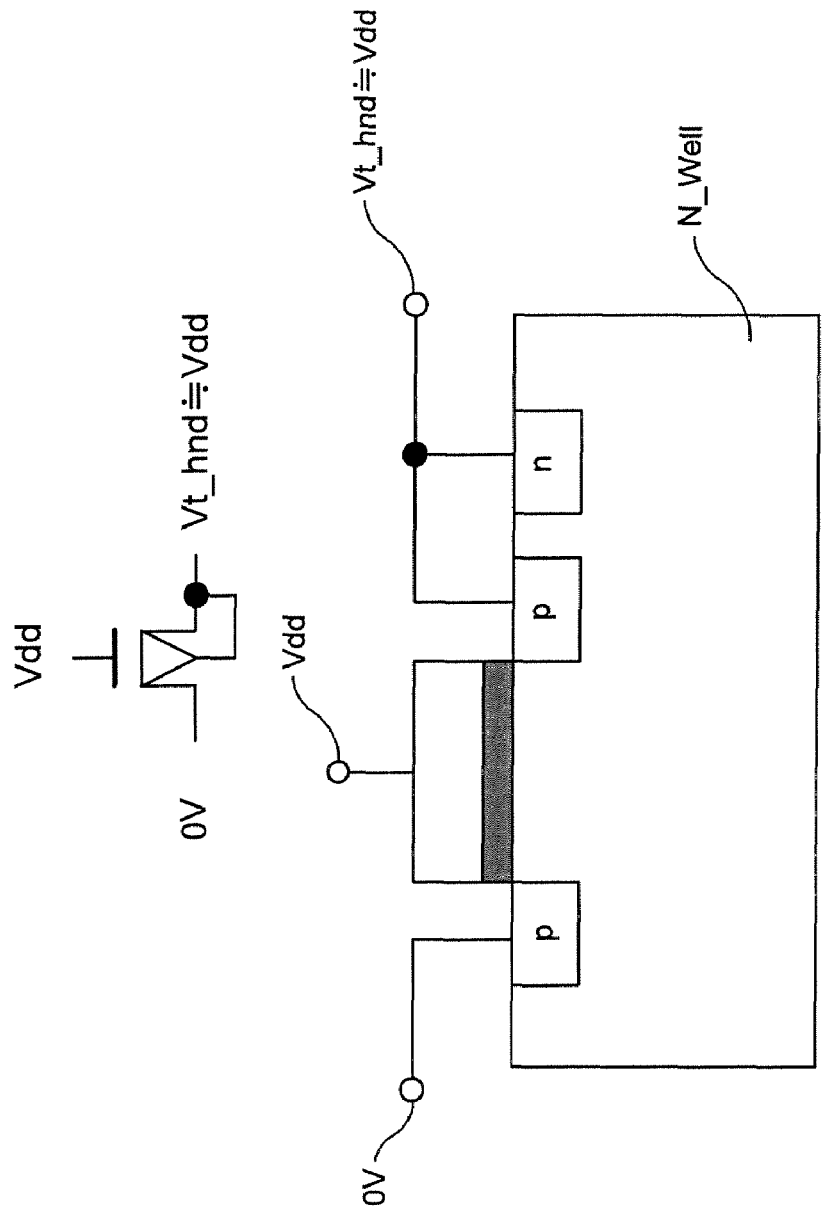
FIG. 17 is a model diagram of a transistor when the P type transistor of the transfer circuit shown in FIG. 15 is OFF.

FIG. 16 is a model diagram of a transistor when a LPE 1502 is ON in the voltage transfer circuit shown in FIG. 15. FIG. 17 is a model diagram of a transistor when the LPE 1502 is OFF in the voltage transfer circuit shown in FIG. 15.

According to the model diagram shown in FIG. 16, the gate voltage of the LPE 1502 shown in FIG. 15 becomes a forward voltage of the diode 1506 lower than Vpp. Vpp is applied to the drain and the source of the LPE 1502. However, because the diode 1506 is inserted, the stress on the oxide layer between the gate and the drain, between the gate and the source and between the gate and the channel is that of only about Vdd and thus it is possible to use a low voltage transistor as the LPE 1502.

Also, the model diagram shown in FIG. 17 shows a drawing when the LPE 1502 shown in FIG. 15 is OFF and the potential of a node VPPOUT is 0 v. Vdd is applied to the LPE 1502 as the gate voltage from a SELn. The potential of the drain of the LPE 1502 is the same as the potential of the node VPPOUT at 0 v. A D type transistor is used as a HND 1501 which is used as a protection circuit of the LPE 1502 stated above. Because the D type has a threshold value (Vt_hnd) of a negative voltage, the potential of the source is a threshold value step higher than the potential of the gate. If the threshold value (Vt_hnd) of the HND 1501 is made to be almost the same as Vdd, because the HND 1501 is 0 v the same as the voltage of the drain of the LPE 1502 and the node VPPOUT, the source of the LPE 1502 is almost equal to Vdd.

In this way, when the diodes 1505 and 1506, each of which has Vf of about Vdd, are inserted between the drain and the gate of the LPE 1502, then a stress of only about Vdd is put on the LPE 1502. Therefore, it is possible to use a low voltage type transistor in the LPE 1502. Consequently, it is possible to transfer Vpp without a voltage drop in Vth (threshold voltage) of the transfer transistor in the transfer circuit or decoder circuit for selectively transferring Vpp and by using a normal LVP (low voltage P type transistor) it is possible to propose a non volatile semiconductor memory device which reduces steps of process and costs.

Further, one or more P type transistors in which a drain and a gate is connected a gate of another, or one or more N type transistors in which a drain and a gate is connected.

Embodiment 1

Figure 2:
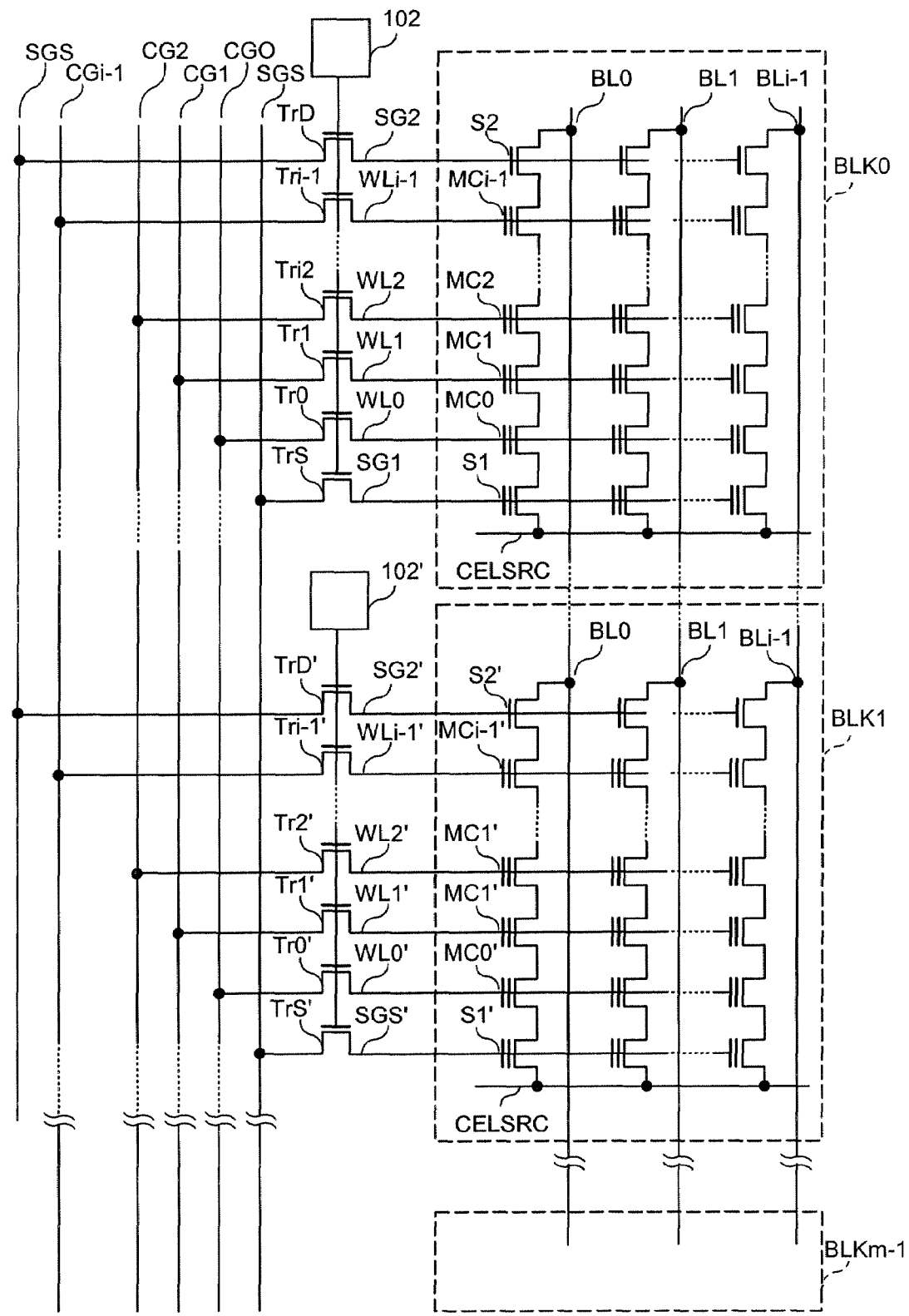
FIG. 2 is a construction diagram of a memory cell array of the first embodiment of the present invention.

FIG. 1 is an outline drawing of a NAND type flash memory which is one representative example of a non volatile semiconductor memory device related to a first embodiment 1 of the present invention. FIG. 2 is a drawing which shows an example of a non volatile semiconductor memory device having m cell array blocks BLKi (i=0 to m−1) each of which includes the memory cell array 103 shown in FIG. 1. Each cell array block BLKi has a plurality of intersecting word lines WL0 to WLi-1 and bit lines BL0 to BLi-1. The bit lines BL0 to BLi-1 are laid astride all the cell array blocks BLKi. A memory cell MC0 to MCi-1 is placed at the intersection of each world line WL0 to WLi-1 and each bit line BL0 to BLi-1. A plurality of floating gate type memory cells MC0 to MCi-1 are comprised of a cell string connected in series. A selection gate transistor S1 is inserted between a common source line CELSRC and the source of the cell at one end of the cell string and a selection gate transistor S2 is inserted between the drain of the cell at the other end and a bit line. A NAND cell unit is comprised of one cell string and 2 selection transistors which are connected to each end of the string.

The control gate of each memory cell MC0 to MCi-1 is connected to a word line WL0 to WLi-1 and the selection gates of the selection gate transistor S1 and S2 are each connected to selection gate lines SG1 and SG2 which are arranged in parallel with the word lines. A group of a plurality of memory cells which run along one word line becomes one page which is the unit of measurement for data read out and data program.

The transfer transistors TrD, Tr0 to Tri-1, and Trs shown in FIG. 1 are the transistors which transfer a program voltage, a read out voltage and an erasure voltage to the selection gate line SG1, the world lines WL0 to WLi-1 and the selection gate line SG2 from node SGD, node CG0 to CGi0-1 and node SGS respectively. Because the transfer transistors TrD, Tr0 to Tri-1 and TrS are N type transistors, a drop in transferred voltage of an amount equal to the threshold voltage (Vth) occurs.

Consequently, a high voltage which is transferred by a block selection switch circuit 102 which acts as a voltage transfer circuit, from VRDEC node 101 supplied to the gates of the transfer transistors Trd, Tr0 to Tri-1 and TrS, is required to be an amount equal to a drop of the transfer transistor voltage (Vth) higher than the program voltage, read out voltage and erasure voltage supplied from the node SGD, node CG0 to CGi0-1 and node SGS.

The block selection switch circuit 102 is selectively controlled to be ON or OFF by HI/LO of a selection signal SEL. For example, when the selection signal SEL is HI the block selection switch circuit 102 becomes ON and a high voltage is supplied from VRDEC node 101 to the gate of the transfer transistors Trd, Tr0 to Tri-1 and TrS. Then, the program voltage, read out voltage or erasure voltage supplied from the node SGD, node CG0 to CGi0-1 and node SGS is transferred to the selection gate line SG1, word line WL0 to WLi-1 and selection gate line SG2.

Alternatively, when the selection signal SEL is LO the block selection switch circuit 102 becomes OFF and the gates of the transfer transistors TrD, Tr0 to Tri-1 and TrS, to which 0 v is supplied, is cut off and the selection gate line SG1, word line WL0 to WLi-1 and selection gate line SG2 become a floating state.

Figure 3:
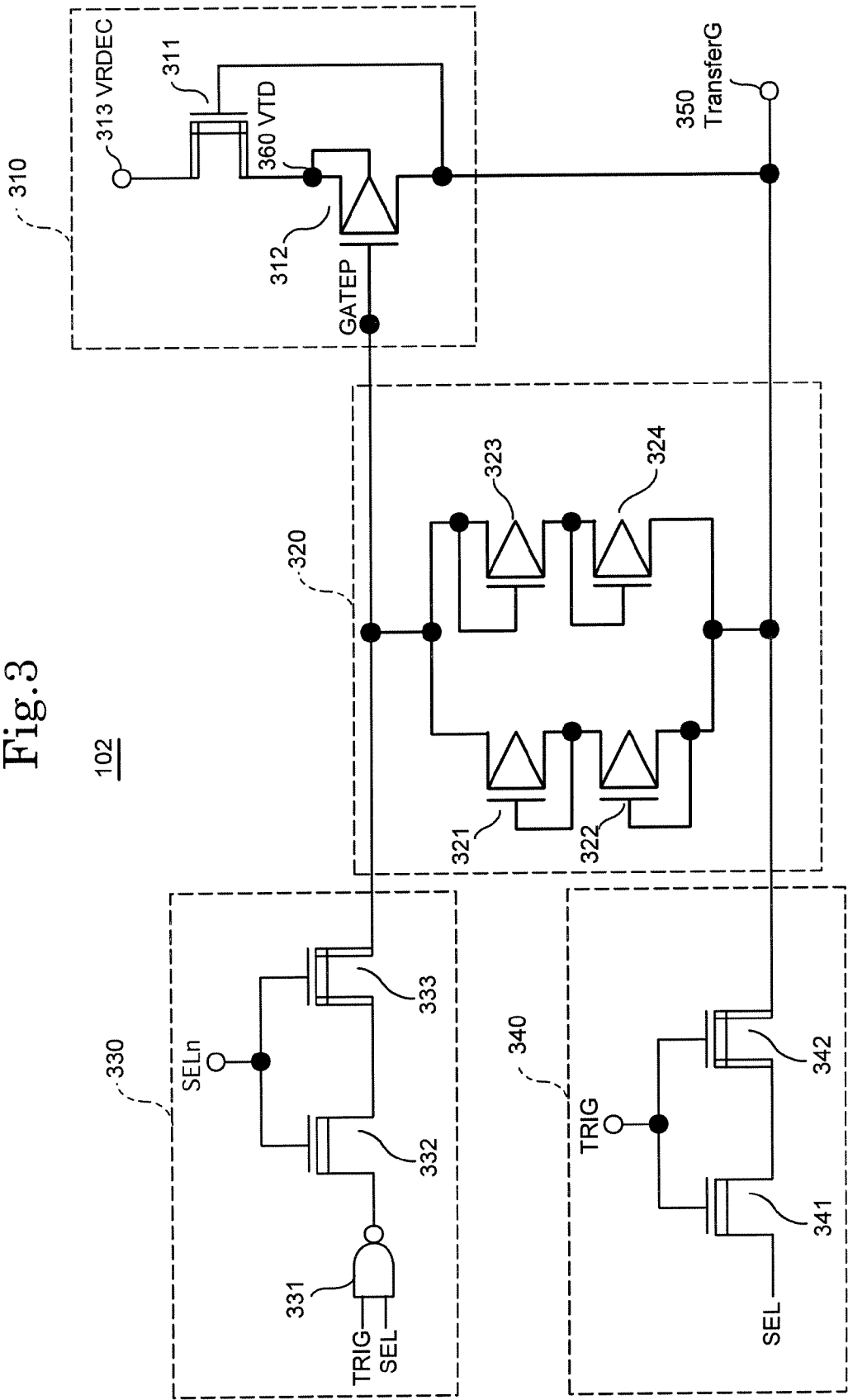
FIG. 3 is a diagram which shows a block selection switch circuit of the non volatile semiconductor memory device related to the first embodiment of the present invention.

FIG. 3 is a drawing which shows the block selection switch circuit of the non volatile semiconductor memory device related to the first embodiment of the present invention. The block selection switch circuit 102 of the non volatile semiconductor memory device related to the first embodiment of the present invention is composed of a VRDEC_TransferG transfer block 310, a diode block 320 and SEL signal transfer blocks 330 and 340. Here, the block selection switch circuit 102 is a voltage transfer circuit and an N type transistor 311 and a P type transistor 312 are included in the transfer block 310.

The VRDEC_TransferG transfer block 310 is composed of a D type high voltage N type transistor (HND) 311 and an E type (Enhancement type) low voltage P type transistor (LPE) 312. A Node 313 is connected to the drain of the HND 311 and a high voltage is supplied from the VRDEC 313.

The diode block 320 is composed of 4 low voltage P type transistors (LPE) 321 to 324. In whichever of the LPE 321 to 324 the gate is connected to the drain and functions as a diode. The LPE 321 and 322 are inserted between the gate and the drain of the LPE 312 to construct a first diode circuit. The LPE 323 and 324 are inserted in an opposite direction to the LPE 321 and 322 between the gate and the drain of the LPE 312 to construct a second diode circuit. As an embodiment, the LPE 323 and 324 are diode connected, and the LPE 321 and 322 are diode connected, however, they are adjusted so that the forward voltage (Vf) of each diode circuit becomes about Vdd. The wells of the LPE 321 to 324 can be connected to either the gate of the LPE 312, the output node 350 or the source of LPE 312 (node VTD 360) however, from the viewpoint of layout area it is preferred that they be connected to the same node VTD 360 as LPE 312. Also, it can be any circuit as long as it fulfills the role of a diode which fulfills the condition Vf=Vdd, for example, an E type high voltage N type transistor or high resistance diode.

The selection signal transfer block 330 is composed of a NAND gate 331, a D type low voltage N type transistor (LND) 332 and a D type high voltage N type transistor (HND) 333. A trigger signal TRIG and a selection signal SEL are input into the input of the NAND gate 331 and the drain of the LND 332 is connected to the output. SELn, which is an inversion signal of the selection signal, is input to the gates of the LND 332 and the HND 333. The source of HND 333 is connected to the gate of the LPE 312 of the VRDEC_TransferG transfer block 310.

The selection signal transfer block 340 is composed of a D type low voltage N type transistor (LND) 341 and a D type high voltage N type transistor (HND) 342. A selection signal SEL is input to the drain of the LND 341, a trigger signal TRIG is input to the gates of the LND 341 and the HND 342, and the source of the HND 342 is connected to the drain of the LPE 312 of the VRDEC_TransferG transfer block 310, the gate of the HND 311, and the output node 350.

Firstly, concerning the transfer operation of the block selection switch circuit 102, an operation when a high voltage is not transferred to the output node 350 from the node VRDEC will be explained. When a high voltage is not transferred to the output node 350 from the node VRDEC, the SEL signal is set at LO (0 v). Because the HND 311 is a D type (depression type) the threshold value becomes negative, the source of the HND 311 has a potential a threshold value Vt_hnd (a value about Vdd) higher than the gate, is charged and becomes floating. Because the SEL signal is LO (0 v) the output of the NAND gate 331 becomes HI (Vdd).

Because the SELn signal which is supplied to the LND 332 and the HND 331 is an inversion signal HI (Vdd) of the SEL signal, the gate of the LPE 312 is applied with Vdd and the LPE 312 is OFF. Because the LPE is OFF the high voltage supplied from the VRDEC is not transferred to the output node 350 and the voltage of the output node 350 becomes 0 v.

Next, the operation when a high voltage is transferred to the output node 350 from the VRDEC (node 313) will be explained. When a high voltage is transferred to the output node 350 from the VRDEC, the SEL signal is HI (Vdd). The pulse of a trigger signal TRIG is input to the gates of the HND 342 and the LND 341 of the selection signal transfer block 340, and the drain of LPE 312, the gate of the HND 311 of the VRDEC_TransferG transfer block 310, and the output node 350 are pre-charged to Vdd. Because the gate of the HND 311 becomes Vdd, the source of the HND 311 (node VTD 360) has a voltage threshold voltage Vt_hnd (a value close to Vdd) high potential. In other words, the potential of the node VTD 360 becomes Vdd+Vt_hnd (≈2Vdd).

On the other hand, because a LO signal (0 v) which is transferred from the selection signal block 330 is applied to the gate of the LPE 312, the LPE 312 is ON, a high voltage from the VRDEC is transferred to the output node 350 and the voltage of output node 350 becomes a high voltage.

Because the potential of the gate of the HND 311 rises by the high voltage transferred from the output node 350, finally a high voltage of the same potential as the high potential supplied from the VRDEC of the node 313 is transferred to the output node.

Together with this, a lower Vf voltage (about Vdd) than the high voltage of the VRDEC transferred to the output node 350 from the VRDEC of the node 313 is applied to the gate of the LPE 312 (node GATEP) via the LPE 321 and 322 of the diode block 320. As a result, there is only a stress of about Vdd between the gate and the source, between the gate and the drain and between the gate and the channel of the LPE 312. Therefore, even if a low voltage transistor is used it is unlikely to break.

Further, when discharging a high voltage transferred to the output node 350, the voltage of the VRDEC is lowered. By the lowering of the voltage of the VRDEC, the voltage of the output node 350 similarly lowers as far as Vdd and when the SEL signal becomes LO (0 v), the voltage of the output node 350 becomes 0 v.

At this time also, between the gate and the source, between the gate and the drain and between the gate and the channel of the LPE 312, there is only a stress of about Vdd. Therefore, even if a low voltage transistor is used it is unlikely to break.

Embodiment 2

Figure 4:
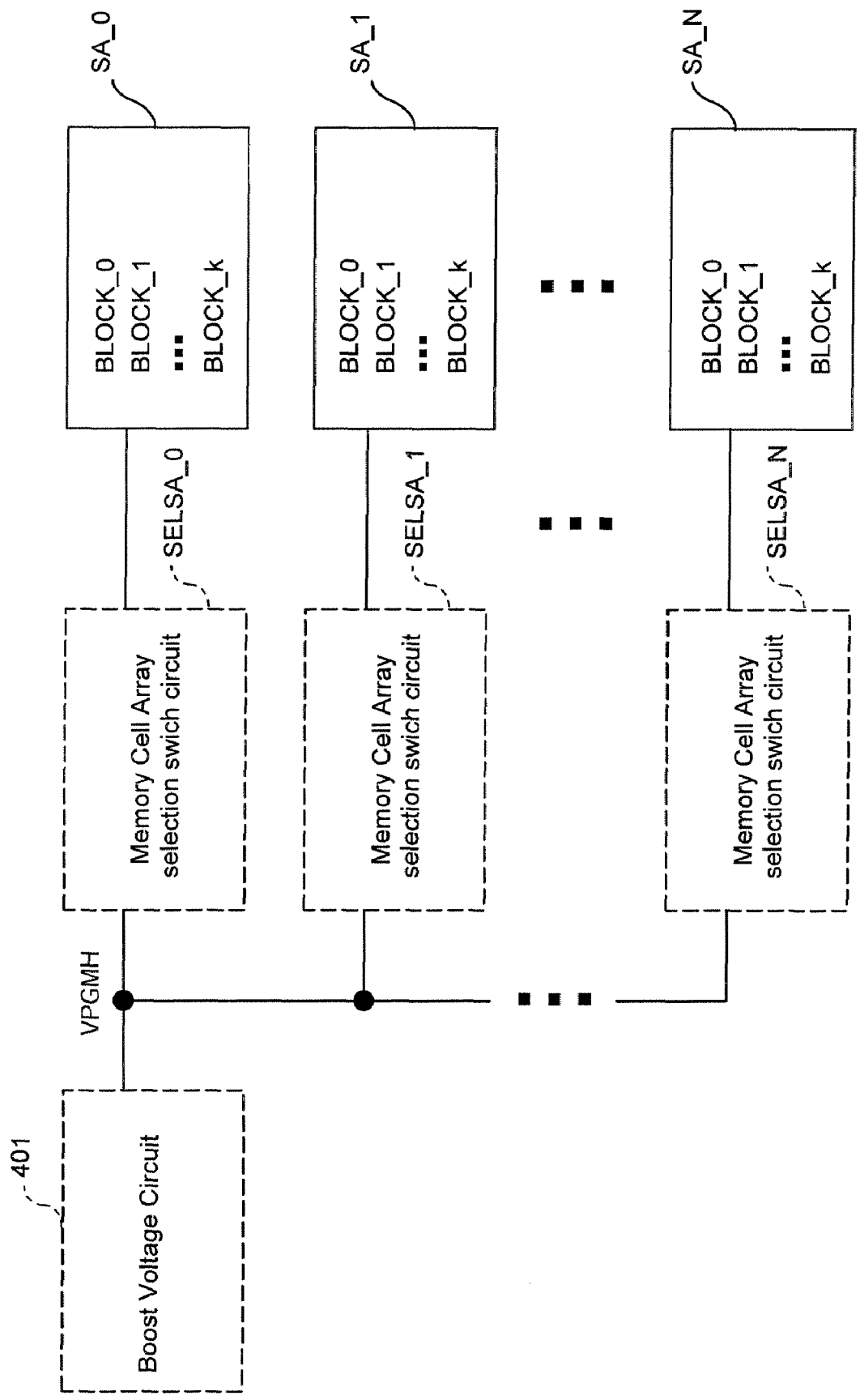
FIG. 4 is an outline diagram of the non volatile semiconductor memory device related to a second embodiment of the present invention.

FIG. 4 is an outline diagram of a non volatile semiconductor memory device related to a second embodiment of the present invention. The non volatile semiconductor memory device related to the second embodiment of the present invention shown in FIG. 4 is comprised of a boost voltage circuit, 401a plurality (n) of memory cell arrays SA_0 to SA_N, and a plurality (n) of memory cell array selection switch circuits SELSA_0 to SELSA_N. Each memory cell array is composed of a plurality of blocks BLK_0 to BLK_k. Each block becomes a unit of erasure and it is possible to erase data of a plurality of blocks (for example, BLK_0 to BLK_7) at one time. The memory cell array selection switch circuit shown in the non volatile semiconductor memory device related to the second embodiment of the present invention shown in FIG. 5 is a selection circuit for selecting a plurality of blocks and selecting a memory cell array.

Figure 5:
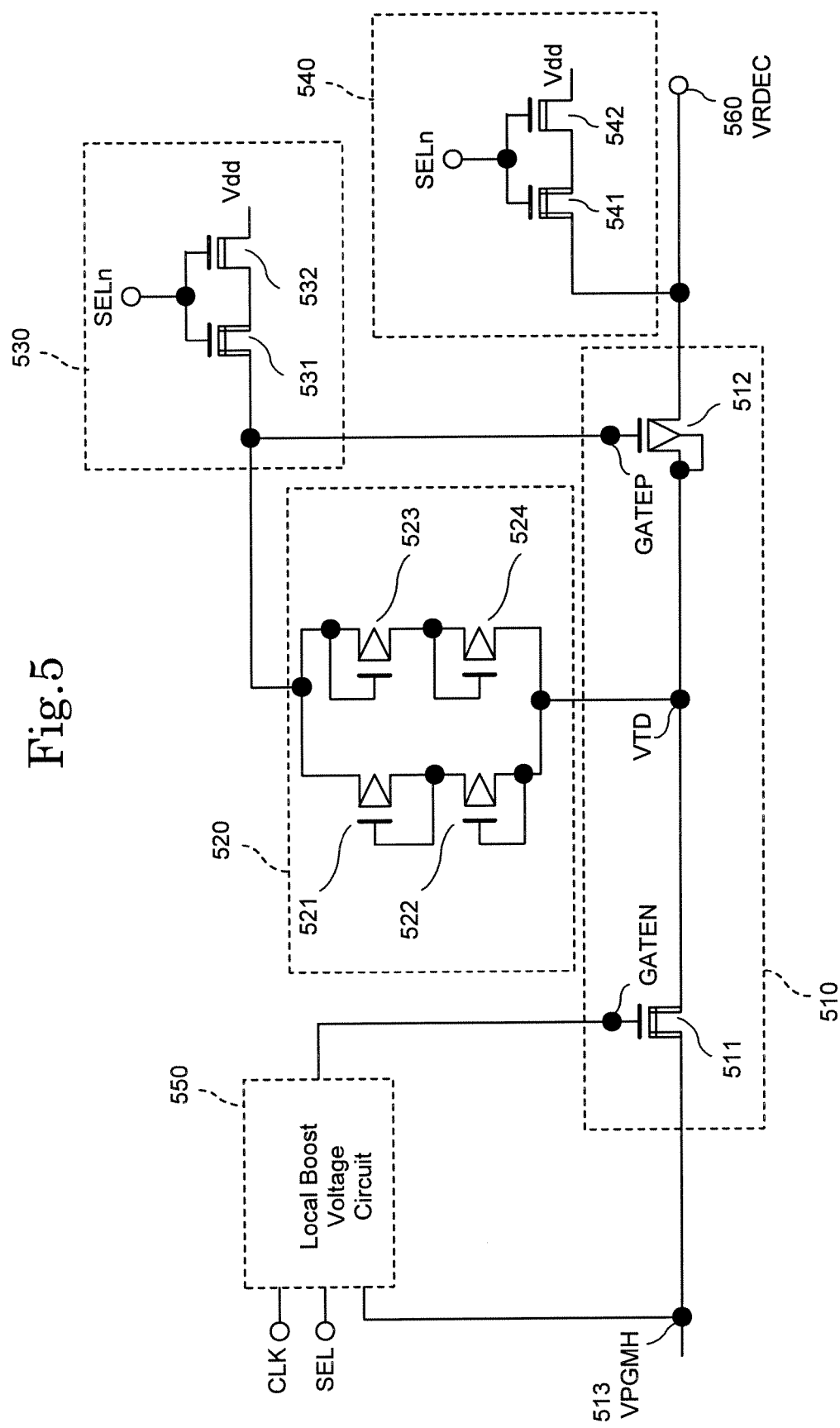
FIG. 5 is a diagram which shows a memory cell array selection switch shown in the non volatile semiconductor memory device related to the second embodiment of the present invention.

FIG. 5 is a diagram which shows the memory cell array selection switch circuit SELSA_0 of the non volatile semiconductor memory device related to the second embodiment of the present invention. The memory cell array selection switch circuit shown in FIG. 5 is a voltage transfer circuit, and as in the first embodiment, transfers a high voltage required to selectively control the memory cell array without a drop in potential. Here, the point different to the first embodiment is the high voltage for selectively switching is kept as it is when selection is switched. In the first embodiment, there is a need to discharge the high voltage of the output node to Vdd or Vss (0 v). The output voltage of the boost voltage circuit of the memory cell array selection switch circuit of the non volatile semiconductor memory device related to the second embodiment of the present invention is maintained at a high voltage and selection switching is performed.

The memory cell array selection switch circuit SELSA_0 of the non volatile semiconductor memory device related to the second embodiment of the present invention is composed of a VPGMH_VRDEC transfer block 510, a diode block 520, Vdd transfer blocks 530 and 540, and a local boost voltage circuit 550.

The VPGMH_VRDEC transfer block 510 is composed of a D type high voltage N type transistor (HND) 511 and an E type low voltage P type transistor (LPE) 512 similar to the VRDEC_TransferG transfer block 310 shown in FIG. 3. A node 513 is connected to a drain of the HND 511 and a high voltage such as program voltage (VPGMH) is supplied. The output of the local boost voltage circuit 550 is connected to a gate of the HND 511. The diode block 520 and a source of the LPE 512 are connected to a source of the HND 511 (node VTD).

The composition and function of the diode block 520 is the same as that of the diode block 320 shown in FIG. 3.

Also, the diode block 520 can be inserted between the drain and the gate of the LPE 512.

The Vdd transfer block 530 is composed of a D type low voltage N type transistor (LND) 531 and a D type high voltage N type transistor (HND) 532. The Vdd transfer block 504 comprises similarly a D type low voltage N type transistor (LND) 541 and a D type high voltage N type transistor (HND) 542. SELn which is an inversion signal of the selection signal SEL is input to the gates of the LND 531 and 541 and the HND 532 and 542. Vdd is applied to the drains of the LND 531 and 541.

Figure 6:
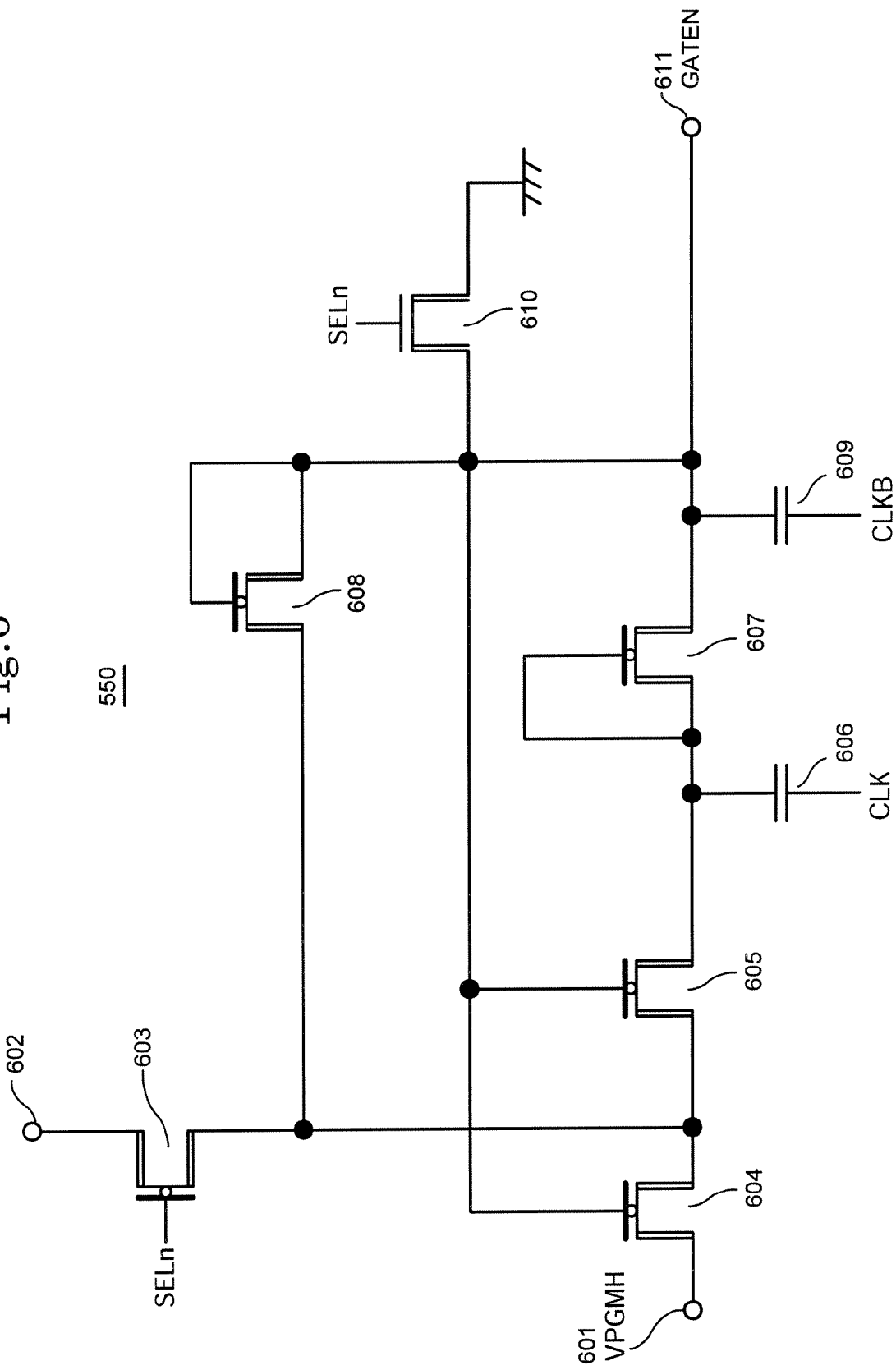
FIG. 6 is a diagram which shows a construction of a local boost voltage circuit in the memory cell array selection switch circuit of the non volatile semiconductor memory device related to the second embodiment of the present invention.

FIG. 6 is a diagram which shows the construction of the local boost voltage circuit 550 inside the memory cell array selection switch circuit of the non volatile semiconductor memory device related to the second embodiment of the present invention shown in FIG. 5. The local boost voltage circuit 550 is a boost voltage circuit which has the basic construction of a Dickson type charge pump circuit. However, it is different to the conventional Dickson type charge pump circuit in that an I type high voltage N type transistor (HNI) 608 is additionally diode connected. The HNI 608 has a threshold value of about 0 V which is lower compared to the E type. The HNI 608 is made to fulfill a limiter circuit role so that the voltage of the node GATEN does not become too high. Also, the gate of the HNE 610 is applied with an inversion signal SELn of the selection signal, the source is connected to the ground and the drain is connected to the node GATEN, so that at the time of unselection, the HNE 610 is ON and it is possible to make the node GATEN a ground voltage 0 v.

The operation at the time of selection and unselection of the memory cell array selection switch circuit of the non volatile semiconductor memory device related to the second embodiment of this invention is explained below. First, at the time of selection, a voltage (VPGMH+α) locally boosted from a program voltage (VPGMH) is supplied to the node GATEN from the local boost circuit 550 shown in FIG. 5. Because the HND 511 is a depression type, if the node GATEN 611 is boosted as far as a voltage above VPGMH it is possible to transfer the VPGMH to be transferred without dropping its potential.

Alternatively, when the gate of the LPE 512 (node GATEP) is made to be in a floating state in advance, a voltage which is a forward voltage (Vf) of the diode lower than the voltage supplied to the node GATEN is applied to the gate of the LPE 512. As a result, while maintaining a voltage of about Vdd between the gate and the source, between the gate and the drain, and between the gate and the channel of the LPE 512, it is possible to transfer VPGMH to the output node 560 without dropping its potential.

At the time of unselection, the SELn signal which is applied to the gate of the HNE 610 of the local boost circuit shown in FIG. 6 is made HI and the node GATEN 611 is made a ground voltage of 0 v, so that the HND 511 is made OFF. By this, while maintaining a high voltage without lowering the voltage of VPGMH it becomes possible to lower the output node voltage. The potential of the node GATEP and the output node 560 becomes a potential of VDD by the Vdd transfer circuit 530 and 540. Because there is only about Vdd stress between the gate and the source, between the gate and the drain and between the gate and the channel in the LPE 512 at the time of unselection it is unlikely to break.

Embodiment 3

Figure 7:
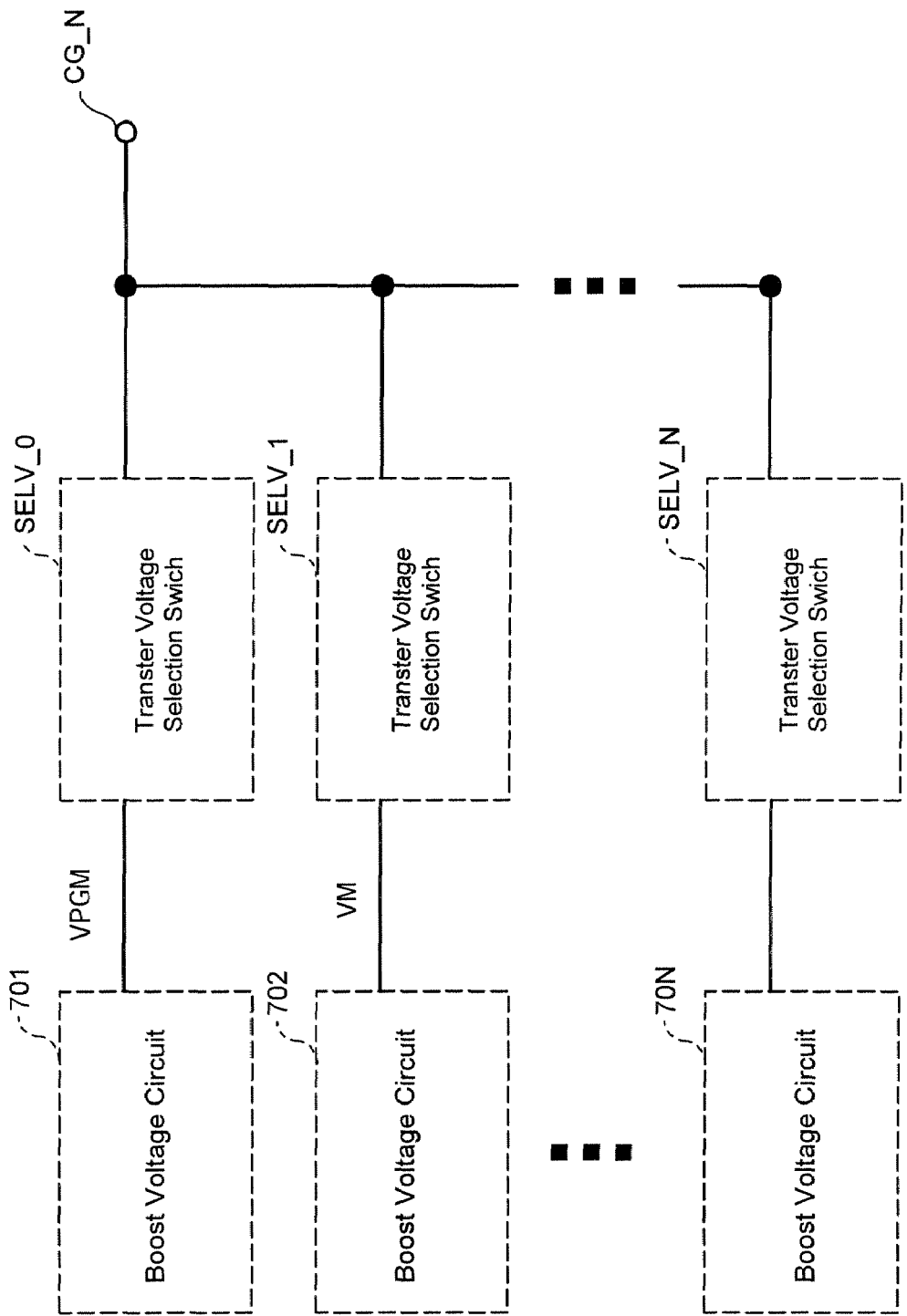
FIG. 7 is an outline diagram of a non volatile semiconductor memory device related to a third embodiment of the present invention.

FIG. 7 is an outline diagram of a non volatile semiconductor memory device related to a third embodiment of the present invention. The non volatile semiconductor memory device related to the third embodiment of the present invention shown in FIG. 7 is composed of a plurality (N) of boost voltage circuits 701 to 70N, a plurality (N) of transfer voltage selection switch circuits SELV_0 to SELV_N, and a memory cell array.

The non volatile semiconductor memory device related to the third embodiment of the present invention shown in FIG. 7 is provided with circuits which selectively transfer supplied voltage to one or more word line (node CG_N) from boost voltage circuits in various operations (read, program, erasure etc)

The non volatile semiconductor memory device related to the embodiment of the present invention shown in FIG. 7, similar to the first embodiment and the second embodiment of the present invention, can transfer a required high voltage without dropping its potential. Also, similar to the second embodiment of the present invention, while maintaining the voltage (for example, VPGM or VM etc) output from the boost voltage circuit and by switching the ON/OFF of local boost voltage circuits separately, switching ON/OFF of transfer is performed. The above operation is shown in FIG. 8.

Figure 8:
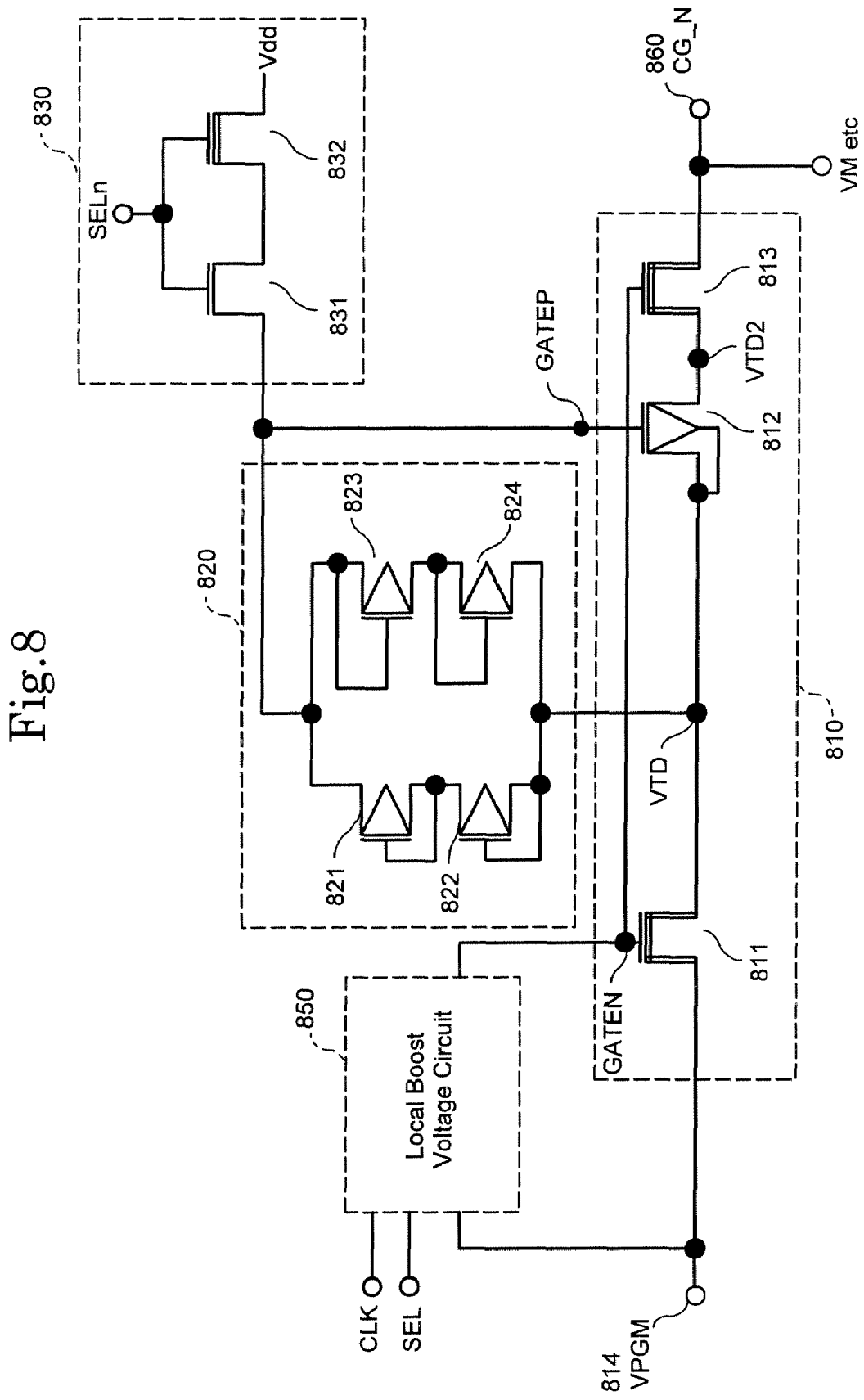
FIG. 8 is a diagram which shows a transfer voltage selection switch circuit used in the non volatile semiconductor memory device related to the third embodiment of the invention.

FIG. 8 is a circuit diagram of a transfer voltage selection switch circuit SELV_0 used in the non volatile semiconductor memory device related to the third embodiment of the present invention. The circuit diagram of the transfer voltage selection switch circuit SELV_0 is composed of a VPGM_CGN transfer block 810, a diode block 820, a Vdd transfer block 830, and a local boost voltage circuit 850.

The VPGM_CGN transfer block 810 is composed of a D type high voltage N type transistor HND 811, an E type low voltage P type transistor LPE 812 and a further protective D type high voltage N type transistor HND 813 which is connected to an output node 860. A node 814 is connected to the drain of the HND 811 and a high voltage such as a program voltage (VPGMH) is supplied. The output of the local boost voltage circuit 850 is connected to the gate of the HND 811. The diode block 820 and the source of the LPE 812 are connected to the source of the HND 811 (node VTD).

The construction and function of the diode block 820 is the same as the diode block 320 shown in FIG. 3.

The Vdd transfer block 830 is composed of a D type low voltage N type transistor LND 831 and a D type high voltage N type transistor HND 832. The gate of the HND 832 is input with SELn which is the conversion signal of the selection signal SEL. Vdd is applied to the drain of the LND 831.

The local boost voltage circuit 850 is the same as the local boost voltage circuit 550 shown in FIG. 6.

The transfer voltage selection switch circuit of the non volatile semiconductor memory device related to the third embodiment of the present invention shown in FIG. 8 is different to the transfer voltage selection switch circuit of the non volatile semiconductor memory device related to the second embodiment of the present invention shown in FIG. 5 in that there is no block which corresponds to Vdd transfer block 540. The third embodiment of the present invention is an embodiment wherein one operation voltage from a plurality of operation voltages is selected and transferred to one output node 860. Even if one transfer voltage selection switch circuit is unselected and doesn't transfer to the output node 860, a high voltage such as VM is supplied from another transfer voltage selection switch circuit to the output node 860. Because the LPE 812 is a low voltage transistor there is a danger that a high voltage stress and breakage may occur. Consequently, a protective D type high voltage N type transistor HND 813 is inserted into the output node to protect the LPE 812. By this, it is possible to selectively transfer a necessary high voltage without dropping its voltage of the transfer transistor Vth (threshold voltage) to the output node 860.

What is claimed is:

1. A non volatile semiconductor memory device comprising a voltage transfer circuit which transfers a transfer voltage boosted from a power supply voltage the voltage transfer circuit including;
    an N type transistor applied with the transfer voltage;
    a P type transistor applied with a transfer control signal;
    a first diode circuit, a forward voltage of which is about the same as the power supply voltage, is inserted between a gate and a drain of the P type transistor; and
    a second diode circuit, a forward voltage of which is about the same as the power supply voltage, is connected in an opposite direction to the first diode circuit and is inserted between the gate and the drain of the P type transistor.

2. The non volatile semiconductor memory device according to claim 1, wherein
    the transfer control signal which is either the power supply voltage or 0 v is applied to the gate of the P type transistor; and
    an inversion signal of the transfer control signal is applied to the gate of the N type transistor.

3. The non volatile semiconductor memory device according to claim 1, wherein
    the gate of the N type transistor together with the drain of the P type transistor is connected to an anode of the first diode circuit, a cathode of the second diode circuit and an output node;
    a source of the N type transistor is connected to a source of the P type transistor; and
    the gate of the P type transistor is connected to a cathode of the first diode circuit and an anode of the second diode circuit.

4. The non volatile semiconductor memory device according to claim 1, wherein
    the voltage transfer circuit further includes a local boost voltage circuit which applies a boosted voltage to the gate of the N type transistor.

5. The non volatile semiconductor memory device according to claim 4, wherein when selected, the local boost voltage circuit locally boosts the transfer voltage and applies the boosted voltage to the gate of the N type transistor, and when unselected, the local boost voltage circuit drops the gate of the N type transistor to a ground voltage so that a selection or an unselection of voltage transfer is performed maintaining the transfer voltage.

6. The non volatile semiconductor memory device according to claim 5, wherein the local boost voltage circuit includes a charge pump circuit and an N type transistor which is diode-connected to the charge pump circuit.

7. The non volatile semiconductor memory device according to claim 1, wherein both the first diode circuit and the second diode circuit has one or more P type transistors where a drain and a gate is connected, or has one or more N type transistors where a drain and a gate is connected.

8. The non volatile semiconductor memory device according to claim 7, wherein wells of the P type transistor of the first diode circuit and the second diode circuit are connected to the same node as the P type transistor of the voltage transfer circuit.

9. The non volatile semiconductor memory device according to claim 1, wherein the N type transistor of the voltage transfer circuit is a depression type and a high voltage type and the P type transistor is an enhancement type and low voltage type.

10. The non volatile semiconductor memory device according to claim, 1 wherein the transfer voltage is either a program voltage to a block, a program pass voltage, a read out voltage or an erasure voltage.

11. A non volatile semiconductor memory device, comprising:
a memory cell array having a plurality of blocks each having a plurality of memory cells arranged in a matrix; and
a voltage transfer circuit which transfers a transfer voltage boosted from a power supply voltage, the voltage transfer circuit transferring a voltage to a block selected from among the plurality of blocks and including;
an N type transistor applied with the transfer voltage,
a P type transistor applied with a transfer control signal,
a first diode circuit, a forward voltage of which is about the same as the power supply voltage, is inserted between a gate and a drain of the P type transistor, and
a second diode circuit, a forward of which voltage is about the same as the power supply voltage, is connected in an opposite direction to the first diode circuit and is inserted between the gate and the drain of the P type transistor.

12. The non volatile semiconductor memory device according to claim 11, wherein
the transfer control signal which is either the power supply voltage or 0 v is applied to the gate of the P type transistor; and
an inversion signal of the transfer control signal is applied to the gate of the N type transistor.

13. The non volatile semiconductor memory device cited in claim 11, wherein
the gate of the N type transistor together with the drain of the P type transistor is connected to an anode of the first diode circuit, a cathode of the second diode circuit and an output node;
the source of the N type transistor is connected to a source of the P type transistor; and
the gate of the P type transistor is connected to a cathode of the first diode circuit and an anode of said second diode circuit.

14. The non volatile semiconductor memory device according to claim 11, wherein the voltage transfer circuit further includes a local boost voltage circuit which applies a boosted voltage to the gate of the N type transistor;
the local boost voltage circuit, when selected, locally boosts the transfer voltage and applies the boosted voltage to the gate of the N type transistor, and when unselected, the local boost voltage circuit drops the voltage of the gate of the N type transistor to a ground voltage so that a selection or an unselection of voltage transfer is performed maintaining the transfer voltage.

15. The non volatile semiconductor memory device according to claim 11, further comprising a plurality of boost voltage circuits each of which outputs a transfer voltage boosted from the power supply voltage to one of the blocks;
the voltage transfer circuit is arranged between the memory cell arrays and each of the plurality of boost voltage circuits, and transfers a voltage selected from among the transfer voltages output from the plurality of the boost voltage circuits to one or more of the blocks selected from among the plurality of blocks.

16. A non volatile semiconductor memory device comprising:
a plurality of memory cell arrays each having a plurality of blocks each having a plurality of memory cells arranged in a matrix; and
a voltage transfer circuit which transfers a transfer voltage boosted from a power supply voltage, the voltage transfer circuit transferring a voltage to a memory cell selected from among the plurality of the memory cells and including;
an N type transistor applied with the transfer voltage,
a P type transistor applied with a transfer control signal,
a first diode circuit, a forward voltage of which is about the same as the power supply voltage, is inserted between a gate and a drain of the P type transistor, and
a second diode circuit, a forward voltage of which is about the same as the power supply voltage, is connected in an opposite direction to the first diode circuit which is inserted between the gate and the drain of the P type transistor.

17. The non volatile semiconductor memory device according to claim 16, wherein
the transfer control signal which is either the power supply voltage or 0 v is applied to the gate of the P type transistor;
an inversion signal of the transfer control signal is applied to the gate of the N type transistor.

18. The non volatile semiconductor memory device according to claim 16, wherein
the gate of the N type transistor together with the drain of the P type transistor is connected to an anode of the first diode circuit, a cathode of the second diode circuit and an output node;
the source of the N type transistor is connected to a source of the P type transistor;
the gate of the P type transistor is connected to a cathode of the first diode circuit and an anode of the second diode circuit.

19. The non volatile semiconductor memory device according to claim 16, wherein the voltage transfer circuit further includes a local boost voltage circuit which applies a boosted voltage to the gate of the N type transistor;
the local boost voltage circuit, when selected, locally boosts the transfer voltage and applies the boosted voltage to the gate of the N type transistor, and when unselected, the local boost voltage circuit drops the voltage of the gate of the N type transistor to a ground voltage, so that a selection or an unselection of voltage transfer is performed maintaining the transfer voltage.

20. The non volatile semiconductor memory device according to claim 16, further comprising a plurality of boost voltage circuits each of which outputs a transfer voltage boosted from the power supply voltage to one of the memory cell arrays; the voltage transfer circuit is arranged between each of the memory cell arrays and each of the plurality of boost voltage circuits, and transfers a voltage selected from among the transfer voltages output from the plurality of the boost voltage circuits to one or more of the memory cell arrays.

* * * * *